United States Patent
Jo et al.

(10) Patent No.: US 9,874,621 B2
(45) Date of Patent: Jan. 23, 2018

(54) METHOD OF GENERATING A SUSCEPTIBILITY WEIGHTED IMAGE

(71) Applicants: Samsung Electronics Co., Ltd., Gyeonggi-do (KR); Korea Advanced Institute of Science and Technology, Daejeon (KR)

(72) Inventors: Jae-moon Jo, Gyeonggi-do (KR); Hyun-wook Park, Daejeon (KR); Yoo-jin Lee, Daejeon (KR); Ye-Ji Han, Daejeon (KR)

(73) Assignees: Samsung Electronics Co., Ltd., Yeongtong-gu, Suwon-si, Gyeonggi-do (KR); Korea Advanced Institute of Science and Technology, Yuseong-gu, Daejeon (KR)

( * ) Notice: Subject to any disclaimer, the term of this patent is extended or adjusted under 35 U.S.C. 154(b) by 1133 days.

(21) Appl. No.: 14/026,311

(22) Filed: Sep. 13, 2013

(65) Prior Publication Data
US 2014/0077808 A1    Mar. 20, 2014

(30) Foreign Application Priority Data

Sep. 18, 2012 (KR) .................. 10-2012-0103609
Mar. 28, 2013 (KR) .................. 10-2013-0033671

(51) Int. Cl.
*G01R 33/56* (2006.01)
*G01R 33/565* (2006.01)

(52) U.S. Cl.
CPC ......... *G01R 33/56* (2013.01); *G01R 33/5608* (2013.01); *G01R 33/56545* (2013.01); *G01R 33/56536* (2013.01)

(58) Field of Classification Search
CPC ............. G01R 33/56; G01R 33/5608; G01R 33/56536; G01R 33/56545
See application file for complete search history.

(56) References Cited

U.S. PATENT DOCUMENTS 5,488,297 A * 1/1996 Nakada ............ G01R 33/56341
                                                          324/307
6,477,398 B1 * 11/2002 Mills ....................... G01R 33/16
                                                          324/201
(Continued)

FOREIGN PATENT DOCUMENTS

CN          101143094 A          3/2008
CN          101632584 A          1/2010
(Continued)

OTHER PUBLICATIONS

Li-Jun Qian et al., Post-processing Algorithm of Susceptibility Weighted Imaging and Its Clinical Application, Computer Engineering, vol. 34, No. 13, Jul. 2008, pp. 1-3.
(Continued)

*Primary Examiner* — Dixomara Vargas
(74) *Attorney, Agent, or Firm* — Cha & Reiter, LLC

(57) ABSTRACT

A method of generating a susceptibility weighted image of an object in a magnetic resonance imaging (MRI) apparatus includes: acquiring at least one first complex data piece corresponding to a radio frequency (RF) signal received from the object by using the RF signal; applying a predetermined filter to the at least one first complex data piece to acquire at least one second complex data piece; generating a susceptibility weighted mask by using the at least one second complex data piece; and applying the susceptibility weighted mask to an MRI image of the object to generate the susceptibility weighted image.

19 Claims, 15 Drawing Sheets

(56) References Cited

U.S. PATENT DOCUMENTS

| | | | |
|---|---|---|---|
| 7,800,367 B2 * | 9/2010 | Bhardwaj | G01R 33/5615 324/307 |
| 7,816,918 B2 * | 10/2010 | Bottomley | G01R 33/3415 324/318 |
| 8,000,769 B2 * | 8/2011 | Yu | G01N 24/08 600/410 |
| 8,761,464 B2 * | 6/2014 | Ma | G01R 33/4828 382/128 |
| 9,165,386 B2 * | 10/2015 | Sato | A61B 5/055 |
| 9,201,129 B2 * | 12/2015 | Ikedo | G01R 33/56316 |
| 9,285,449 B2 * | 3/2016 | Liu | G01R 33/443 |
| 2003/0212322 A1 | 11/2003 | Haacke | |
| 2008/0071167 A1 | 3/2008 | Ikedo et al. | |
| 2011/0304330 A1 | 12/2011 | Yoneda et al. | |
| 2014/0035583 A1 | 2/2014 | Kimura | |

FOREIGN PATENT DOCUMENTS

| | | | |
|---|---|---|---|
| JP | 4982881 B2 | 5/2012 | |
| WO | 2008/132698 A1 | 11/2008 | |
| WO | 2009/081786 A1 | 7/2009 | |

OTHER PUBLICATIONS

Chinese Search Report dated May 24, 2016.

Haacke, E. Mark, et al.; "Susceptibility Weighted Imaging (SWI);" Magnetic Resonance in Medicine 52; 2004; pp. 612-618.

Haacke, E. Mark, et al.; "Susceptibility-Weighted Imaging: Technical Aspects and Clinical Applications, Part 1;" American Journal of Neuroradiology 30; Jan. 2009; pp. 19-30.

Rauscher, A., et al.; "Automated Unwrapping of MR Phase Images Applied to BOLD MR-Venography at 3 Tesla;" Journal of Magnetic Resonance Imaging 18; 2003; pp. 175-180.

Chinese Search Report, dated Jan. 5, 2017.

Wang, et al.; "Artery and Vein Separation Using Susceptibility-Dependent Phase in Contrast-Enhanced MRA"; Journal of Magnetic Resonance Imaging; May 16, 2000; Wiley-Liss, Inc.

Rauscher, et al.; "Improved Phase Processing in Susceptibility Weighted Imaging"; Proc. Intl. Soc. Mag. Reson. Med.; 2007.

Lee, et al.; "A New Susceptibility-Weighted Image Reconstruction Method for the Reduction of Background Phase Artifacts"; 2014; Wiley Periodicals, Inc.

European Search Report dated Aug. 11, 2017.

* cited by examiner

FIG. 2A

| a 8π/9 | b 8π/9 | c 8π/9 | d 8π/9 | e 8π/9 |
|---|---|---|---|---|
| f 8π/9 | g 8π/9 | h 8π/9 | i 8π/9 | j 8π/9 |
| k 8π/9 | l 8π/9 | m 8π/9 | n 8π/9 | o 8π/9 |
| p 8π/9 | q 8π/9 | r 8π/9 | s 8π/9 | t 8π/9 |
| u 8π/9 | v 8π/9 | w 8π/9 | x 8π/9 | y 8π/9 |

FIG. 2B

| a 8π/9 | b 8π/9 | c 8π/9 | d 8π/9 | e 8π/9 |
|---|---|---|---|---|
| f 8π/9 | g 8π/9 | h 8π/9 | i −π | j 8π/9 |
| k 8π/9 | l 8π/9 | m 8π/9 | n 8π/9 | o 8π/9 |
| p 8π/9 | q −2π/9 | r 8π/9 | s 8π/9 | t 8π/9 |
| u 8π/9 | v 8π/9 | w 8π/9 | x 8π/9 | y 8π/9 |

FIG. 4

| a | $r(\cos 8\pi/9 + i\sin 8\pi/9)$ | b | $r(\cos 8\pi/9 + i\sin 8\pi/9)$ | c | $r(\cos 8\pi/9 + i\sin 8\pi/9)$ | d | $r(\cos 8\pi/9 + i\sin 8\pi/9)$ | e | $r(\cos 8\pi/9 + i\sin 8\pi/9)$ |
|---|---|---|---|---|---|---|---|---|---|
| f | $r(\cos 8\pi/9 + i\sin 8\pi/9)$ | g | $r(\cos 8\pi/9 + i\sin 8\pi/9)$ | h | $r(\cos 8\pi/9 + i\sin 8\pi/9)$ | i | $r(\cos(-\pi) + i\sin(-\pi))$ | j | $r(\cos 8\pi/9 + i\sin 8\pi/9)$ |
| k | $r(\cos 8\pi/9 + i\sin 8\pi/9)$ | l | $r(\cos 8\pi/9 + i\sin 8\pi/9)$ | m | $r(\cos 8\pi/9 + i\sin 8\pi/9)$ | n | $r(\cos 8\pi/9 + i\sin 8\pi/9)$ | o | $r(\cos 8\pi/9 + i\sin 8\pi/9)$ |
| p | $r(\cos 8\pi/9 + i\sin 8\pi/9)$ | q | $r(\cos(-2\pi/9) + i\sin(-2\pi/9))$ | r | $r(\cos 8\pi/9 + i\sin 8\pi/9)$ | s | $r(\cos 8\pi/9 + i\sin 8\pi/9)$ | t | $r(\cos 8\pi/9 + i\sin 8\pi/9)$ |
| u | $r(\cos 8\pi/9 + i\sin 8\pi/9)$ | v | $r(\cos 8\pi/9 + i\sin 8\pi/9)$ | w | $r(\cos 8\pi/9 + i\sin 8\pi/9)$ | x | $r(\cos 8\pi/9 + i\sin 8\pi/9)$ | y | $r(\cos 8\pi/9 + i\sin 8\pi/9)$ |

FIG. 6

| a | b | c | d | e |
|---|---|---|---|---|
| 0 | 0 | r(−0.01 − 0.04i) | r(−0.01 − 0.04i) | r(−0.01 − 0.04i) |
| f | g | h | i | j |
| 0 | 0 | r(−0.01 − 0.04i) | r(0.06 + 0.3i) | r(−0.01 − 0.04i) |
| k | l | m | n | o |
| r(−0.19 + 0.11i) | r(−0.19 + 0.11i) | r(−0.18 + 0.15i) | r(−0.01 − 0.04i) | r(−0.01 − 0.04i) |
| p | q | r | s | t |
| r(−0.19 + 0.11i) | r(1.51 − 0.87i) | r(−0.19 + 0.11i) | 0 | 0 |
| u | v | w | x | y |
| r(−0.19 + 0.11i) | r(−0.19 + 0.11i) | r(−0.19 + 0.11i) | 0 | 0 |

FIG. 8A

| a | b | c | d | e |
|---|---|---|---|---|
|   | cos 8π/9 + isin 8π/9 | cos 8π/9 + isin 8π/9 | cos(−2π/9) + isin(−2π/9) | cos(−2π/9) + isin(−2π/9) |
| cos 8π/9 + isin 8π/9 | | | | |

| f | g | h | i | j |
|---|---|---|---|---|
| cos 8π/9 + isin 8π/9 | cos 8π/9 + isin 8π/9 | cos 8π/9 + isin 8π/9 | cos(−2π/9) + isin(−2π/9) | cos(−2π/9) + isin(−2π/9) |

| k | l | m | n | o |
|---|---|---|---|---|
| cos 8π/9 + isin 8π/9 | cos 8π/9 + isin 8π/9 | cos 8π/9 + isin 8π/9 | cos(−2π/9) + isin(−2π/9) | cos(−2π/9) + isin(−2π/9) |

| p | q | r | s | t |
|---|---|---|---|---|
| cos 8π/9 + isin 8π/9 | cos(−2π/9) + isin(−2π/9) | cos 8π/9 + isin 8π/9 | cos 8π/9 + isin 8π/9 | cos 8π/9 + isin 8π/9 |

| u | v | w | x | y |
|---|---|---|---|---|
| cos 8π/9 + isin 8π/9 | cos 8π/9 + isin 8π/9 | cos 8π/9 + isin 8π/9 | cos 8π/9 + isin 8π/9 | cos 8π/9 + isin 8π/9 |

FIG. 8B

| a | b | c | d | e |
|---|---|---|---|---|
| −0.94 + 0.34i (1) | −0.94 + 0.34i (1) | −0.56 + 0.12i (0.57) | −0.18 − 0.1i (0.2) | −0.18 − 0.1i (0.2) |
| f | g | h | i | j |
| −0.94 + 0.34i (1) | −0.94 + 0.34i (1) | −0.37 + 0.01i (0.37) | 0.2 − 0.31i (0.37) | 0.2 − 0.31i (0.37) |
| k | l | m | n | o |
| −0.75 + 0.23i (0.78) | −0.75 + 0.23i (0.78) | −0.37 + 0.01i (0.37) | −0.18 − 0.1i (0.2) | −0.18 − 0.1i (0.2) |
| p | q | r | s | t |
| −0.75 + 0.23i (0.78) | −0.75 + 0.23i (0.78) | −0.56 + 0.12i (0.57) | −0.56 + 0.12i (0.57) | −0.56 + 0.12i (0.57) |
| u | v | w | x | y |
| −0.75 + 0.23i (0.78) | −0.75 + 0.23i (0.78) | −0.75 + 0.23i (0.78) | −0.94 + 0.34i (1) | −0.94 + 0.34i (1) |

FIG. 8C

| a | b | c | d | e |
|---|---|---|---|---|
| 0 (0) | 0 (0) | −0.38 + 0.22i (0.44) | 0.95 − 0.54i (1.09) | 0.95 − 0.54i (1.09) |

| f | g | h | i | j |
|---|---|---|---|---|
| 0 (0) | 0 (0) | −0.57 + 0.33i (1.01) | 0.57 − 0.33i (1.01) | 0.57 − 0.33i (1.01) |

| k | l | m | n | o |
|---|---|---|---|---|
| −0.19 + 0.11i (0.22) | −0.19 + 0.11i (0.22) | −0.57 + 0.33i (1.01) | 0.95 − 0.54i (1.09) | 0.95 − 0.54i (1.09) |

| p | q | r | s | t |
|---|---|---|---|---|
| −0.19 + 0.11i (0.22) | 1.52 − 0.87i (1.75) | −0.38 + 0.22i (0.44) | −0.38 + 0.22i (0.44) | −0.38 + 0.22i (0.44) |

| u | v | w | x | y |
|---|---|---|---|---|
| −0.19 + 0.11i (0.22) | −0.19 + 0.11i (0.22) | −0.19 + 0.11i (0.22) | 0 (0) | 0 (0) |

FIG. 8D

| a | b | c | d | e |
|---|---|---|---|---|
| 0 | 0 | 0.01 | 0.29 | 0.29 |

| f | g | h | i | j |
|---|---|---|---|---|
| 0 | 0 | 0.38 | 0.38 | 0.38 |

| k | l | m | n | o |
|---|---|---|---|---|
| 0 | 0 | 0.38 | 0.29 | 0.29 |

| p | q | r | s | t |
|---|---|---|---|---|
| 0 | 1.53 | 0.01 | 0.01 | 0.01 |

| u | v | w | x | y |
|---|---|---|---|---|
| 0 | 0 | 0 | 0 | 0 |

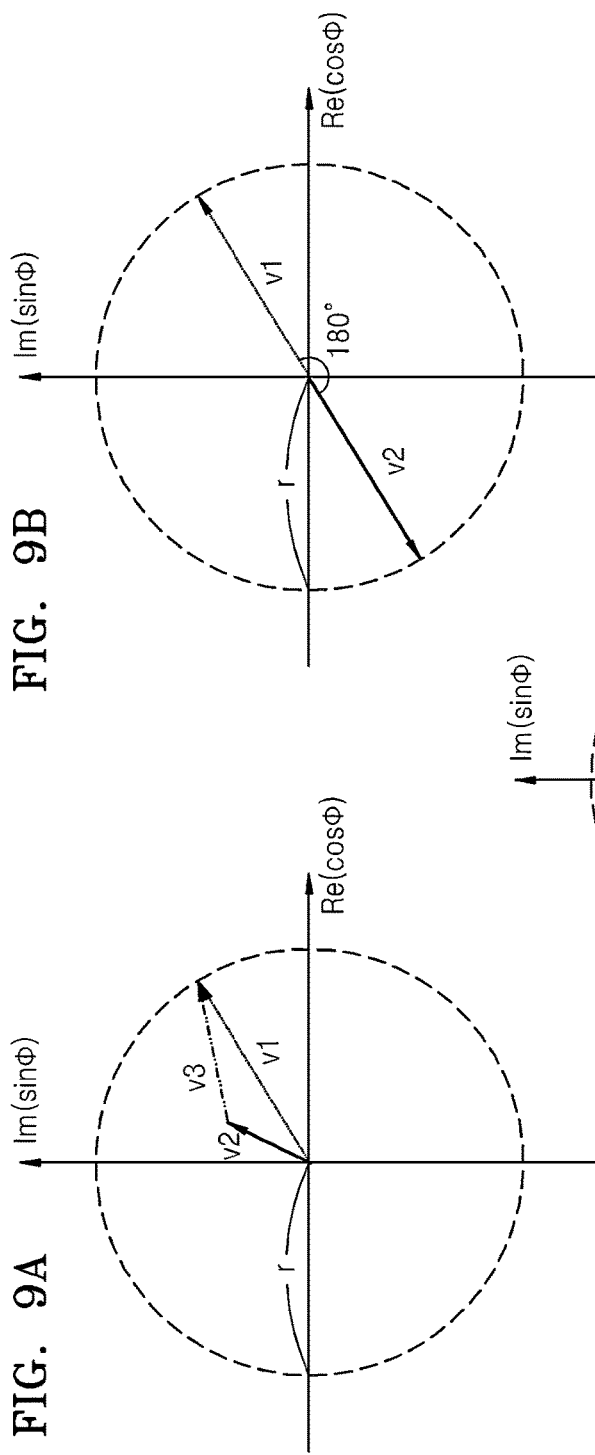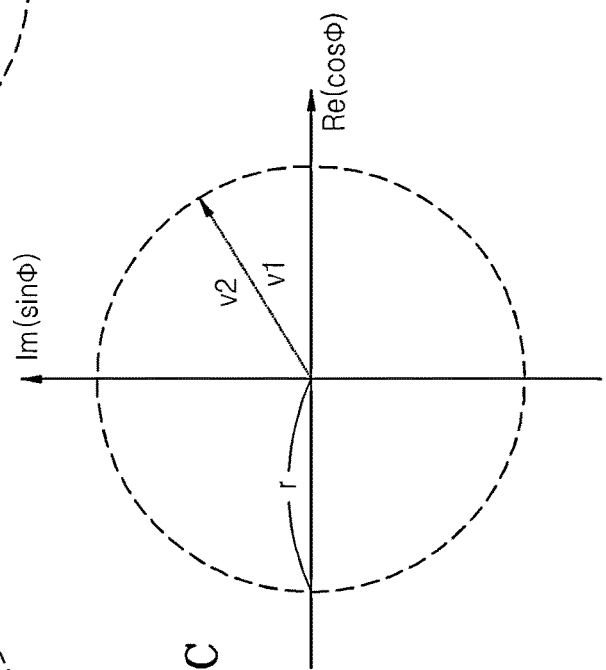
FIG. 9A
FIG. 9B
FIG. 9C

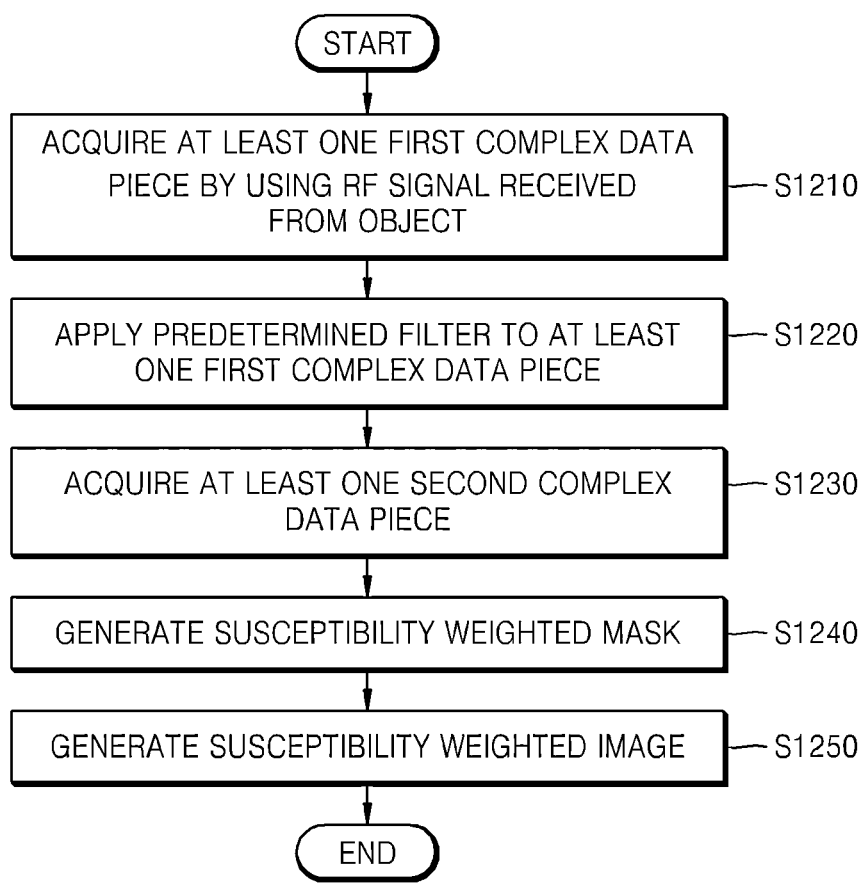

METHOD OF GENERATING A SUSCEPTIBILITY WEIGHTED IMAGE

CROSS-REFERENCE TO RELATED PATENT APPLICATIONS

This application claims, pursuant to 35 USC 119(a), priority to and the benefit of the earlier filing date of Korean Patent Application No. 10-2012-0103609, filed on Sep. 18, 2012, and Korean Patent Application No. 10-2013-0033671, filed on Mar. 28, 2013, in the Korean Intellectual Property Office, the entire disclosures of which are incorporated herein by reference in their entirety.

BACKGROUND

1. Field of the Invention

The present disclosure relates to a magnetic resonance imaging (MRI) apparatus, and more particularly, to an MRI apparatus which generates a susceptibility weighted image of an object and a method of generating a susceptibility weighted image of an object by using the same.

2. Description of the Related Art

Magnetic resonance imaging (MRI) systems are non-invasive, provide a high tissue contrast compared to computed tomography (CT) apparatuses, and do not generate artifacts that are caused by bone tissues. In addition, since the MRI systems are able to photograph various cross-sections of an object in desired directions without the necessity to change the position of the object, the MRI systems are widely used together with other image diagnosing apparatuses.

MRI systems generate MRI images by using a difference between the characteristics of tissues of an object in order to increase the contrast of an MRI image. In other words, the difference between the characteristics of tissues of the object is indicated in MRI images, and thus, a user is able to easily distinguish the tissues of an MRI image from each other.

Susceptibility weighted images are MRI images having an enhanced contrast by indicating susceptibility differences between tissues of an object. In particular, since susceptibility differences exist between gray matters and white matters, between iron-containing tissues and neighboring tissues, and between vein blood vessels and neighboring tissues, an MRI image having an enhanced contrast may be obtained by indicating the susceptibility differences in the MRI image.

SUMMARY

The present disclosure provides a magnetic resonance imaging (MRI) apparatus and a method of generating a susceptibility weighted image by using the MRI apparatus, by which artifacts generated in the susceptibility weighted image due to phase wrapping may be effectively removed.

According to an aspect of the present disclosure, there is provided a method of generating a susceptibility weighted image of an object in a magnetic resonance imaging (MRI) apparatus. The method may include: acquiring at least one first complex data piece corresponding to an a radio frequency (RF) signal received from the object; applying a predetermined filter to the at least one first complex data piece to acquire at least one second complex data piece; generating a susceptibility weighted mask by using the at least one second complex data piece; and applying the susceptibility weighted mask to an MRI image of the object to generate the susceptibility weighted image.

The generating of the susceptibility weighted mask may include: acquiring a magnitude value of the at least one second complex data piece; and generating the susceptibility weighted mask by using the acquired magnitude value.

The acquiring of the at least one second complex data piece may include: setting a magnitude value of the at least one first complex data piece to a predetermined constant value; and applying a high frequency filter to the at least one first complex data piece having the magnitude value set to the predetermined constant value to acquire the at least one second complex data piece.

The generating of the susceptibility weighted mask may include: applying a low pass filter to the at least one first complex data piece having the magnitude value set to the predetermined constant value to acquire at least one third complex data piece; and generating the susceptibility weighted mask by using a value obtained by subtracting the predetermined constant value from a sum of the magnitude value of the at least one second complex data piece and the magnitude value of the at least one third complex data piece.

The generating of the susceptibility weighted mask may include: normalizing the magnitude value of the at least one second complex data piece to a value between 0 and 1.

The normalizing of the magnitude value of the at least one second complex data piece may include: dividing the magnitude value of the at least one second complex data piece by a product of the predetermined constant value and 2.

The generating of the susceptibility weighted mask may further include: dividing the value obtained by subtracting the predetermined constant value from a sum of the magnitude value of the at least one second complex data piece and the magnitude value of the at least one third complex data piece by a product of the predetermined constant value and 2 to normalize the value obtained by the subtraction to a value between 0 and 1.

The acquiring of the at least one second complex data piece may include: applying a high frequency filter to imaginary data of the at least one first complex data piece to acquire the at least one second complex data piece.

The generating of the susceptibility weighted image may include: multiplying the MRI image of the object by the susceptibility weighted mask a predetermined number of times to generate the susceptibility weighted image.

According to an aspect of the present disclosure, there is provided a magnetic resonance imaging (MRI) apparatus including: a first data acquirer which acquires at least one first complex data piece corresponding to an RF signal received from an object; a second data acquirer which applies a predetermined filter to the at least one first complex data piece to acquire at least one second complex data piece; a mask generator which generates a susceptibility weighted mask by using the at least one second complex data piece; and an image generator which applies the susceptibility weighted mask to an MRI image of the object to generate a susceptibility weighted image.

The mask generator may generate the susceptibility weighted mask by using a magnitude value of the at least one second complex data piece.

The second data acquirer may set a magnitude value of the at least one first complex data piece to a predetermined constant value and applies a high frequency filter to the at least one first complex data piece having the magnitude value set to the predetermined constant value to acquire the at least one second complex data piece.

The second data acquirer may apply a low pass filter to the at least one first complex data piece having the magnitude value set to the predetermined constant value to acquire at least one third complex data piece. The mask generator may generate the susceptibility weighted mask by using a value obtained by subtracting the predetermined constant value from a sum of the magnitude value of the at least one second complex data piece and the magnitude value of the at least one third complex data piece.

The mask generator may normalize a magnitude value of the at least one second complex data piece to a value between 0 and 1.

The mask generator may divide the magnitude value of the at least one second complex data piece by a product of the predetermined constant value and 2 to normalize the magnitude value of the at least one second complex data piece.

The mask generator may divide the value obtained by subtracting the predetermined constant value from a sum of the magnitude value of the at least one second complex data piece and the magnitude value of the at least one third complex data piece by a product of the predetermined constant value and 2 to normalize the value obtained by the subtraction to a value between 0 and 1.

The second data acquirer may apply a high frequency filter to imaginary data of the at least one first complex data piece to acquire the at least one second complex data piece.

The image generator may multiply the MRI image of the object by the susceptibility weighted mask a predetermined number of times to generate the susceptibility weighted image.

According to an aspect of the present disclosure, there is provided a non-transitory computer-readable recording medium having recorded thereon a program for executing the method.

BRIEF DESCRIPTION OF THE DRAWINGS

The features of the present disclosure will become more apparent by describing in embodiments thereof with reference to the attached drawings in which:

FIG. 2A illustrates phase values of radio frequency (RF) signals emitted from regions of an object when a magnetic gradient field is applied to a section of the object;

FIG. 2B illustrates a change in the phase value of each region due to a macroscopic magnetic field change and a microscopic magnetic field change;

FIG. 4 illustrates first complex data of an RF signal emitted from at least one region of an object in the MRI apparatus of FIG. 3;

FIG. 6 illustrates second complex data acquired by applying a high frequency filter to first complex data in the MRI apparatus illustrated in FIG. 3;

FIG. 8A illustrates first complex data of an RF signal emitted from at least one region of an object, in an MRI apparatus according to an alternative embodiment of the present disclosure;

FIG. 8B illustrates at least one third complex data piece acquired by applying a low frequency filter to the first complex data of FIG. 8A and a magnitude value of the at least one third complex data piece;

FIG. 8C illustrates at least one second complex data piece acquired by applying a high frequency filter to the first complex data of FIG. 8A and a magnitude value of the at least one second complex data piece;

FIG. 8D illustrates values acquired by subtracting a predetermined constant value from a value acquired by adding the magnitude value of the third complex data of FIG. 8B and the magnitude value of the second complex data of FIG. 8C;

FIGS. 9A, 9B and 9C illustrate a range of the values acquired by subtracting the predetermined constant value from the value acquired by adding the magnitude value of the second complex data and the magnitude value of the third complex data;

FIG. 12 is a flowchart illustrating a method of generating a susceptibility weighted image according to an embodiment of the present disclosure.

DETAILED DESCRIPTION

The disclosure is described with reference to the accompanying drawings. In the description of the disclosure, a detailed description of known related functions and components may be omitted to avoid unnecessarily obscuring the subject matter of the disclosure. The disclosure may, however, be embodied in many different forms and should not be construed as limited to the embodiments. In addition, terms of the disclosure, which are defined with reference to the functions of the disclosure, may be implemented differently depending on a user or operator's intention and practice. Therefore, the terms should be understood on the basis of the disclosure throughout the specification. The principles and features of the disclosure may be employed in varied and numerous embodiments without departing from the disclosure.

The same reference numbers are used throughout the drawings to refer to the same or similar parts. Furthermore, although the drawings represent embodiments of the disclosure, the drawings are not necessarily to scale and certain features may be exaggerated or omitted in order to more clearly illustrate and describe the disclosure.

The terms "unit" refers to, but is not limited to, a software or hardware component, such as a Field Programmable Gate Array (FPGA) or Application Specific Integrated Circuit (ASIC), which performs certain tasks. A unit may reside on an addressable storage medium and may be executed by or controlled by at least one processor. Thus, examples of a unit may include components, such as software components, object-oriented software components, class components and task components, processes, functions, attributes, procedures, subroutines, segments of program code, drivers, firmware, microcode, circuitry, data, database, data structures, tables, arrays, and variables. The functionality provided in the components and units may be combined into fewer components and units or further separated into additional components and units.

Figure 1:
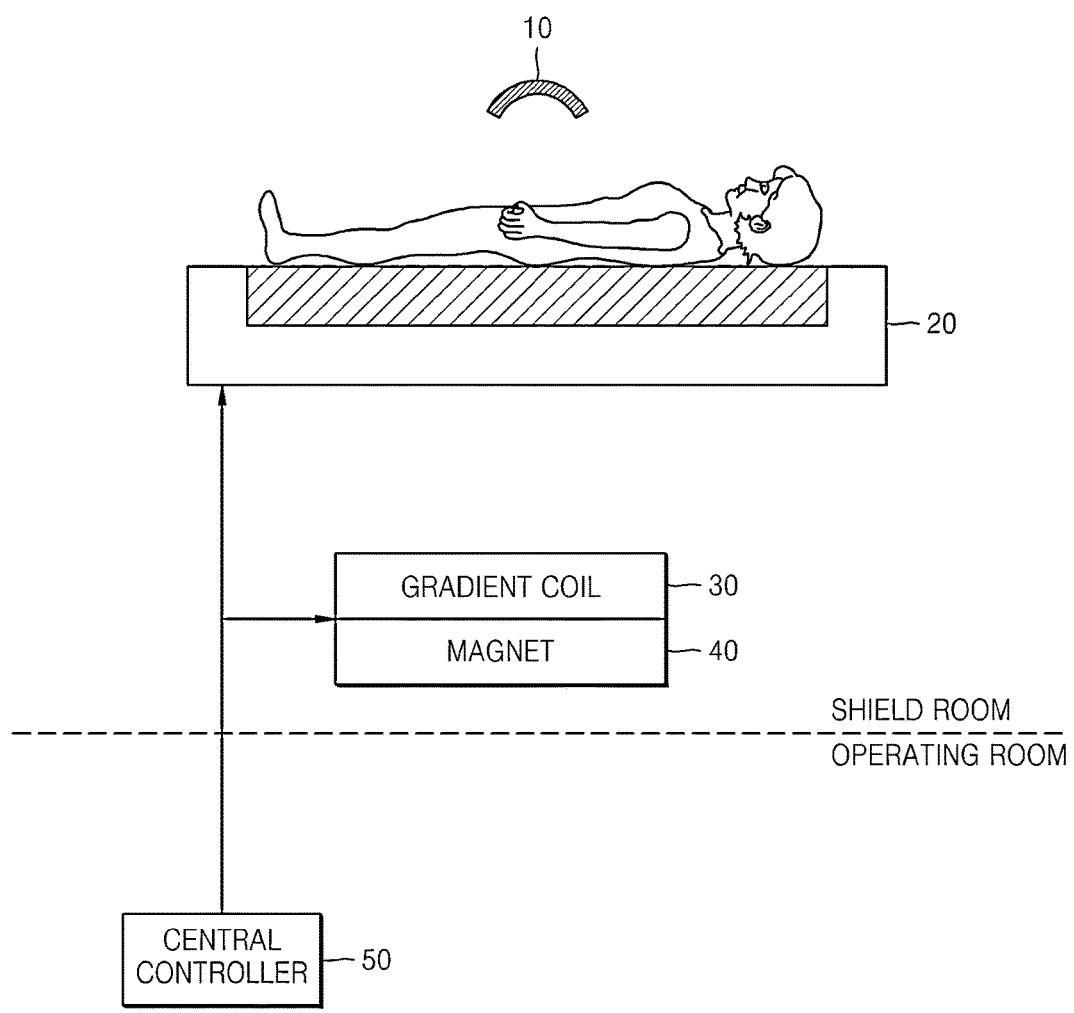
FIG. 1 is a diagram illustrating a magnetic resonance imaging (MRI) system.

FIG. 1 is a diagram illustrating a magnetic resonance imaging (MRI) system. Referring to FIG. 1, the MRI system includes a radio frequency (RF) coil 10, a body coil 20, a gradient coil 30, and a main magnet 40, which are all placed in a shield room, and a central controller 50, which is placed in an operating room positioned outside the shield room. The central controller 50 may include a display and/or an input unit, and a user may view an MRI image through the display or may control the MRI system through the input unit and/or the display; for example, the display may include a touch screen which implements the input unit to control the MRI system of FIG. 1.

When a patient undergoes medical examination and lies in a cylindrical gantry in the shield room shielded from external radio frequency (RF) signals, a magnetic field is formed within the cylindrical gantry by the main magnet 40, and a magnetic field gradient pulse is transmitted by the gradient coil 30 to form a magnetic gradient field. When a magnetic field is formed outside the body of the patient, atomic nuclei within the body of the patient perform a precessional motion in a direction of the magnetic field. A frequency of the precessional motion (i.e., a resonance frequency) is proportional to an intensity of the magnetic field formed outside the body of the patient according to the Lamor equation. When an RF pulse having the same frequency as the resonance frequency is transmitted toward the atomic nuclei that perform the precessional motion at the resonance frequency, and then the transmission of the RF pulse is interrupted, the atomic nuclei emit energy absorbed from the RF pulse, and the MRI system acquires an MRI image by using an RF signal emitted from the atomic nuclei. The RF coil 10 or the body coil 20 applies an RF pulse having a resonance frequency to the patient to obtain an MRI image, receives an RF signal generated from a particular part of the patient, and transmits the RF signal to the central controller 50 of the operating room which is separated from the shield room. The RF signal is finally converted into the MRI image through signal processing. The gradient coil 30 forms the magnetic gradient field, which differently induces resonance frequencies of parts of the body of the patient. The MRI system may identify a location of each region of the body of the patient through the differently-induced resonance frequencies.

FIG. 1 illustrates a schematic structure of a general MRI system, and thus, the present disclosure may be applied to various types of MRI systems.

FIG. 2A illustrates phase values of RF signals emitted from regions of an object when a magnetic gradient field is applied to a section of the object. The phase value of each of the regions is mapped to a phase value between $-\pi$ and $\pi$.

The object may be an organ of a human body or an animal from which an MRI image is to be acquired, or a particular part of the human body or the animal.

Referring to FIG. 2A, the object may include 25 regions (a through y regions), each of which may correspond to each of the pixels of an MRI image. Although the object includes the 25 regions in FIG. 2A, the number of regions included in the object is not limited to 25.

A phase value marked in each region of the object represents a phase value of an RF signal emitted from each region at a predetermined time. As shown in FIG. 2A, the phase value of each region is $8\pi/9$.

FIG. 2B illustrates a change in the phase value of each region due to a macroscopic magnetic field change and a microscopic magnetic field change.

Referring to i and q regions of FIG. 2B, phase values of the i and q regions illustrated in FIG. 2A are changed. Firstly, phase values of regions are changed due to non-uniformity of the magnetic field formed by the main magnet 40 of FIG. 1.

Secondly, the phase values of the regions are changed due to susceptibility differences between atoms respectively included in the regions. In other words, the phase values of the regions are changed due to a difference between respective susceptibilities of tissues of the object, or due to a difference between respective susceptibilities of tissues adjacent to air.

A change in a phase value due to non-uniformity of a magnetic field and a change in a phase value due to the difference between the respective susceptibilities of air and a tissue adjacent to air are each referred to as a phase value change due to a macroscopic magnetic field change. A change in a phase value due to differences between respective susceptibilities of tissues of an object is referred to as a phase value change due to a microscopic magnetic field change.

Since a susceptibility weighted image is an MRI image in which susceptibility differences between tissues of an object are indicated, the microscopic magnetic field change needs to be taken into account, but the macroscopic magnetic field change is excluded. In general, the macroscopic magnetic field change causes a phase value change at a low rate (i.e., a low-frequency phase change), and the microscopic magnetic field change causes a phase value change at a high rate (i.e., a high-frequency phase change).

Referring to FIGS. 2A and 2B, the phase value of the i region of FIG. 2B is a result of changing the phase value of the i region of FIG. 2A by $\pi/9$. In other words, the i region of FIG. 2B has a phase value of $-\pi$ by increasing the phase value of the i region of FIG. 2A by $\pi/9$.

Also, the phase value of the q region of FIG. 2B is a result of changing the phase value of the q region of FIG. 2A by $8\pi/9$. In other words, the q region of FIG. 2B has a phase value of $-(2/9)\pi$ by increasing the phase value of the q region of FIG. 2A by $8\pi/9$.

A phase change by a predetermined value or more may be determined as a phase change caused by a microscopic magnetic field change, and phase change lower than the predetermined value may be determined as a phase change caused by a macroscopic magnetic field change. For example, the predetermined value may include $5\pi/9$. Therefore, the change in the phase value of the i region of FIG. 2B may be regarded as a phase value change caused by a macroscopic magnetic field change, and the change of the phase value of the q region may be regarded as a phase value change caused by a microscopic magnetic field change.

In a susceptibility weighted image generating method in the related art, respective phase values of the regions of an object are used to generate a susceptibility weighted mask. In particular, a high frequency filter is applied to the phase value of each region of the object to generate a mask that emphasizes ambient regions of an object and regions of the object having significantly different phase values, and the mask is applied to an MRI image of the object to generate a susceptibility weighted image.

Referring to FIG. 2B, although the phase value of the i region of FIG. 2B is a result of changing the phase value of the i region of FIG. 2A by $\pi/9$, a difference between the phase values of an h region and the i region of FIG. 2B is $17\pi/9$ ($=8\pi/9-(-9\pi/9)$) and is greater than a difference between the phase values of a p region and the q region of FIG. 2B, that is, $10\pi/9$ ($=8\pi/9-(-2\pi/9)$). Accordingly, when a high frequency filter is applied to the phase value of each region of FIG. 2B, the i and q regions having significantly different phase values from adjacent other regions are emphasized. Since the phase value change in the i region of FIG. 2B is due to a macroscopic magnetic field change, it is not taken into account. However, according to the susceptibility weighted image generating method of the related art, a susceptibility image in which an i region is weighted is generated because the respective phase values of regions are mapped to discontinuous values between $-\pi$ and $\pi$. In other words, according to the susceptibility weighted image generating method in the related art, the susceptibility weighted image may include artifacts due to phase wrapping.

Figure 3:
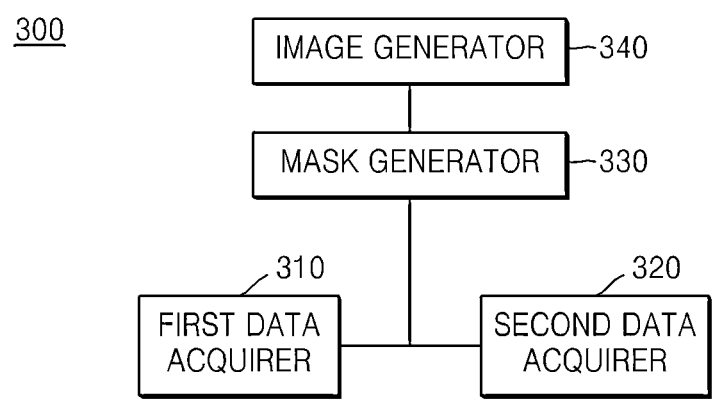
FIG. 3 is a block diagram of an MRI apparatus according to an embodiment of the present disclosure.

In an MRI apparatus 300 and a method of generating a susceptibility weighted image by using the MRI apparatus 300 according to an embodiment of the present disclosure, as shown in FIG. 3, a susceptibility weighted mask is generated not by using phase value differences between regions of an object but by using complex data differences between the regions of the object, thereby preventing artifacts from being generated by phase wrapping.

FIG. 3 is a block diagram illustrating a structure of the MRI apparatus 300 according to an embodiment of the present disclosure.

Referring to FIG. 3, the MRI apparatus 300 includes a first data acquirer 310, a second data acquirer 320, a mask generator 330, and an image generator 140.

The MRI apparatus 300 may be included in the central controller 50 of FIG. 1, and the first data acquirer 310, the second data acquirer 320, the mask generator 330, and the image generator 340 may all be implemented by a microprocessor and/or an integrated circuit.

The first data acquirer 310 acquires at least one piece of first complex data associated with an object by using an RF signal received from the object.

The central controller 50 of the MRI system of FIG. 1 determines an appropriate echo delay time (TE) using susceptibility differences between tissues of the object, and controls the RF coil 10 or the body coil 20 so that an RF pulse is transmitted to a tissue of the object according in a gradient echo (GRE) sequence having the determined TE.

The first data acquirer 310 acquires k-space data by using the RF signal that the RF coil 10 receives, and also performs an inverse Fourier transformation on the k-space data to acquire at least one piece of first complex data. The at least one first complex data piece may be expressed by a magnitude value and a phase value of complex data.

The second data acquirer 320 applies a predetermined filter to the at least one first complex data piece to acquire at least one piece of second complex data. The predetermined filter may include a high frequency filter. The high frequency filter may be applied by subtracting values acquired by applying a low frequency filter to the at least one first complex data piece from the at least one first complex data.

When the high frequency filter is applied to a predetermined region having a large first complex data difference from adjacent regions, the predetermined region may be emphasized more than other regions having relatively smaller first complex data differences from the adjacent regions.

A difference between two complex data pieces in the present specification refers to a magnitude value of complex data that is acquired by subtracting one of two complex data pieces from the one of two complex data pieces.

The magnitude values of respective pieces of first complex data of at least one regions of the object may be different from each other, and thus, the second data acquirer 320 may set the magnitude value of at least one first complex data piece to be a predetermined constant value and may apply a high frequency filter to the first complex data piece of which the magnitude value has been set to be the predetermined constant value. The predetermined constant value may be set to 1.

FIG. 4 illustrates first complex data acquired from an RF signal emitted from at least one region of the object in the MRI apparatus 300 of FIG. 3. Phase values of the first complex data of FIG. 4 are equal to the phase values illustrated in FIG. 2. The magnitude value of the first complex data of FIG. 4 is set to be a constant value $\gamma$. In FIG. 4, i indicates an imaginary number.

In the susceptibility weighted image generating method in the related art, a high frequency filter is applied to the phase values illustrated in FIG. 2. However, in an embodiment of the present disclosure, a high frequency filter is applied to the first complex data illustrated in FIG. 4, thereby preventing artifacts from being generated by phase wrapping.

Figure 5:
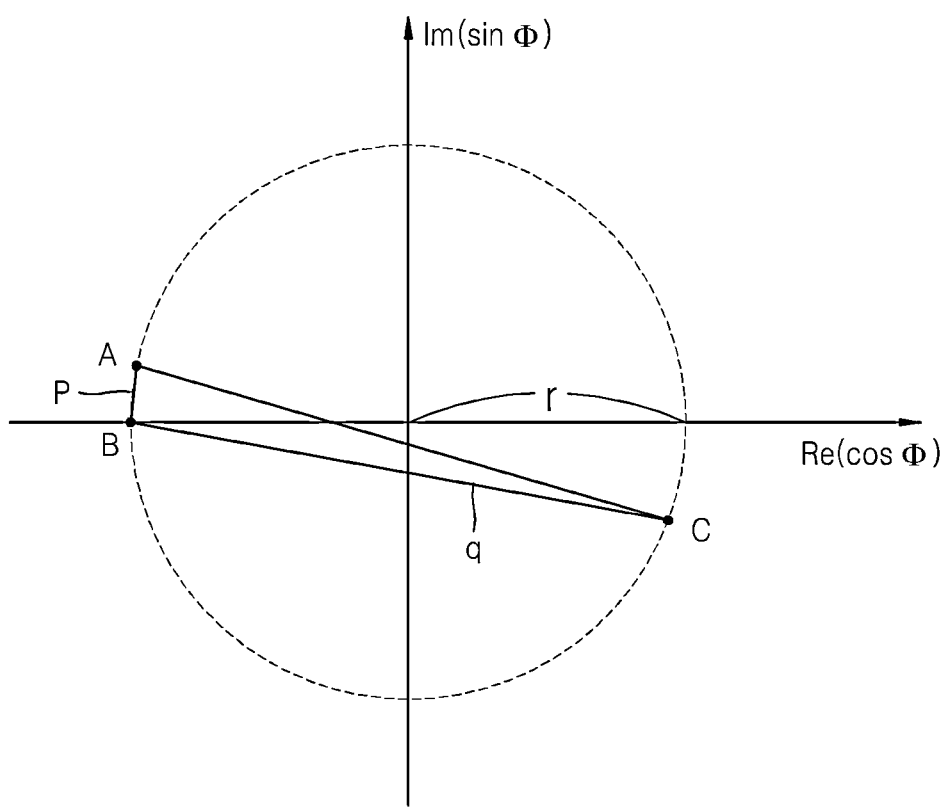
FIG. 5 is a coordinate plane illustrating first complex data differences between the regions of the object caused by phase value differences between the regions of the object in the MRI apparatus of FIG. 3.

FIG. 5 is a coordinate plane illustrating first complex data differences between regions of the object caused by phase value differences between the regions of the object in the MRI apparatus 300 of FIG. 3.

A phase value change of the i region of FIG. 4 is due to a macroscopic magnetic field change, and thus, is excluded when generating a mask. A phase value change of the q region of FIG. 4 is due to a microscopic magnetic field change, and thus, is used when generating the mask.

The coordinate plane of FIG. 5 has a real number axis as an axis x and an imaginary number axis as an axis y. The x-coordinate on the real number axis corresponds to $\cos \Phi$, and the y-coordinate on the imaginary number axis corresponds to $\sin \Phi$. $\Phi$ is a phase value.

In FIG. 5, a point A corresponds to first complex data of the h and p regions of FIG. 4, a point B corresponds to first complex data of the i region of FIG. 4, and a point C corresponds to first complex data of the q region of FIG. 4.

Referring to FIG. 5, although a phase value difference between the points A and B is $17\pi/9$, a first complex data difference p between the points A and B is significantly smaller than a first complex data difference q between the points B and C. In other words, since the phase value difference between the points A and B is greater than that between the points B and C but the first complex data difference p between the points A and B is smaller than the first complex data difference q between the points B and C, a high frequency filter may be applied to the first complex data of FIG. 4 to emphasize the q region more than the i region.

FIG. 6 illustrates second complex data acquired by applying a high frequency filter to first complex data in the MRI apparatus 300 illustrated in FIG. 3. The results illustrated in FIG. 6 may be acquired by applying a low frequency filter to the first complex data of FIG. 4 and subtracting the first complex data to which the low frequency filter is applied from first complex data. The results of FIG. 6 are acquired with first complex data of regions except the regions a through y of FIG. 4 being $r(\cos 8\pi/9 + i \sin 8\pi/9)$.

When the low frequency filter is applied to the first complex data of FIG. 4, an average value of first complex data of a predetermined region illustrated in FIG. 4 and first complex data of 8 regions adjacent to the predetermined region may be determined as a value of the predetermined region. The number of adjacent regions may be variously set, and are not limited to the 8 regions shown in FIG. 4.

For example, when the low frequency filter is applied to the a specific region of FIG. 4, such as the i region, for example, a value of the i region to which the low frequency filter is applied may be determined by Equation (1). In Equation (1), c', d', e', h', i', j', m', n', o' are weights for acquiring an average value, may be set to 1, or may be set to various values other than 1.

Value of the i region=(c'*(first complex data of the c region)

+d'*(first complex data of the d region)

+e'*(first complex data of the e region)

+h'*(first complex data of the h region)

+i'*(first complex data of the i region)

+j'*(first complex data of the j region)

+m'*(first complex data of the m region)

+n'*(first complex data of the n region)

+o'*(first complex data of the o region))/9    (1)

Regions except the q region are filtered by the high frequency filter, and thus, have second complex data having magnitude values of 0 or magnitude values approximate to 0. As the magnitude value of the second complex data of each region has a large difference from first complex data of adjacent regions, the magnitude value of the second complex data of each region is large. According to an embodiment of the present disclosure, besides the low and high frequency filters of the disclosure, other low and high frequency filters may also be used.

The mask generator 330 generates a susceptibility weighted mask by using a magnitude value of at least one second complex data piece. For example, a magnitude value of second complex data in the form of X+Yi may be acquired by Equation (2).

$$X+Yi=\sqrt{X^2+Y^2} \quad (2)$$

The mask generator 330 normalizes the acquired magnitude value to a value between 0 and 1 to generate a susceptibility weighted mask. When a high frequency filter is applied to first complex data having a magnitude value set to r, the first complex data to which the high frequency filter has been applied has a magnitude value between 0 and 2r. Therefore, the mask generation unit 330 may divide the magnitude value of the second complex data by 2r to normalize it. The magnitude value of the second complex data having a value between 0 and 2r will be described later with reference to FIGS. 9A-9C.

The susceptibility weighted mask generated by using the normalized magnitude value of the second complex data brightens regions having large susceptibility differences from adjacent regions. However, a mask generated by using a value obtained by subtracting the normalized magnitude value of the second complex data from 1 may darken the regions having large susceptibility differences from the adjacent regions.

The image generator 340 applies the susceptibility weighted mask to an MRI image of the object to generate a susceptibility weighted image, which is displayed to a user. The MRI image of the object may be generated by using the magnitude value of the first complex data acquired from the RF signal received from at least one region of the object.

Alternatively, the image generator 340 may multiply values corresponding to the susceptibility weighted mask by values corresponding to the MRI image of the object a predetermined number of times to generate and display a susceptibility weighted image in order to increase a contrast to noise ratio (CNR) of the susceptibility weighted image. For example, the predetermined number of times may range from 3 times to 5 times.

Figure 7A:
FIG. 7A illustrates an MRI image of an object.
Figure 7B:
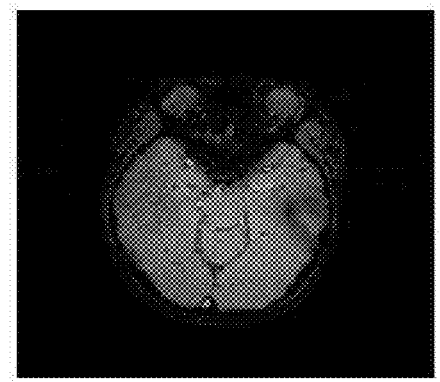
FIG. 7B illustrates a generated susceptibility weighted image according to an embodiment of the present disclosure.

FIG. 7A is a view illustrating an MRI image of an object, and FIG. 7B is a view illustrating a generated and displayed susceptibility weighted image according to an embodiment of the present disclosure. Referring to FIG. 7B, a contrast between tissues of the object is better than that between tissues of the object illustrated in FIG. 7A.

An MRI apparatus 300 shown in FIG. 3 according to an embodiment of the present disclosure may further include a display to display the generated susceptibility weighted image.

Although a phase value difference due to a macroscopic magnetic field change causes a low-frequency phase change, a high-frequency phase change may also be caused by the macroscopic magnetic field change. For example, a phase value change due to a susceptibility difference between insides of ears and air adjacent to the insides of the ears may cause a high-frequency phase change.

FIG. 8A illustrates first complex data of an RF signal emitted from at least one region of an object in an MRI apparatus according to an alternative embodiment of the present disclosure. First complex data of regions except in certain regions (the a through y regions) illustrated in FIG. 8A may be cos 8π/9+i sin 8π/9.

If phase values of d, e, i, j, n, and o regions are generated due to a susceptibility difference between air and a tissue adjacent to air, a phase value change caused by a macroscopic magnetic field change may not be excluded by using a high frequency filter.

To solve this problem, the second data acquirer 320 applies a low frequency filter to at least one first complex data piece having a magnitude value set to r to acquire at least one third complex data piece. In FIG. 8A, r is set to 1.

FIG. 8B illustrates a magnitude value of at least one third complex data piece of FIG. 8A acquired by applying a low frequency filter to the first complex data of FIG. 8A with a magnitude value of at least one third complex data piece. Values written in parentheses in FIG. 8B are magnitude values of third complex data of the corresponding regions.

In general, a range in which a phase value is changed due to a microscopic magnetic field change is narrower than a range in which a phase value is changed due to a macroscopic magnetic field change. This is because venous blood in which a phase value changes has a very small area compared to air adjacent to tissues. Since an averaging effect is generated when a low frequency filter is applied to an image, the first complex data of a q region of FIG. 8A has no difference from third complex data of adjacent regions. However, third complex data of d, e, i, j, n, and o regions have differences from the third complex data of the adjacent regions. Also, referring to FIG. 8B, magnitude values of the third complex data of the d, e, j, n, and o regions are relatively smaller than those of third complex data of the other regions.

When a high frequency filter is applied to the first complex data pieces of FIG. 8A, regions having large first complex data differences from adjacent regions are emphasized. FIG. 8C is a view illustrating magnitude values of second complex data acquired by applying a high frequency filter to the first complex data pieces of FIG. 8A and magnitude values of second complex data.

Referring to FIG. 8C, magnitude values of second complex data of d, e, i, j, n, and q regions are relatively greater than those of second complex data of the other regions.

When third complex data is acquired by applying a low frequency filter to first complex data having a magnitude value set to r, the magnitude value of the third complex data has a value between 0 and r. Therefore, the magnitude value of the third complex data may be subtracted from r to reverse the magnitude value of the third complex data. Therefore, referring to FIG. 8B, when the magnitude values of the third complex data of the d, e, i, j, n, and o regions smaller than those of third complex data of the other regions are reversed, the magnitude values of the third complex data of the d, e, i, j, n, and o regions may become relatively greater than those of the third complex data of the other regions.

If the reversed magnitude value of the third complex data is subtracted from the magnitude value of the second complex data, a q region may have a relatively greater value than other regions. FIG. 8D is a view illustrating values acquired by subtracting a predetermined constant value from a sum of the magnitude value of the third complex data of FIG. 8B and the magnitude value of the second complex data of FIG. 8C. The mask generator 330 may generate a susceptibility weighted mask by using the value obtained by subtracting the predetermined constant value from a sum of the magnitude value of the second complex data and the magnitude value of the third complex data.

Since the value obtained by subtracting the predetermined constant value from the sum of the magnitude values of the second complex data and the third complex data is between 0 and 2r, the mask generator 330 may divide the subtraction result by 2r to normalize it to a value between 0 and 1.

FIGS. 9A through 9C are coordinate planes illustrating a range of a value obtained by subtracting a predetermined constant value from a sum of a magnitude value of second complex data and a magnitude value of third complex data.

Referring to FIG. 9A, a vector v1 is first complex data of a predetermined region, and a vector v2 is average complex data of the first complex data of the predetermined region and first complex data pieces of regions adjacent to the predetermined region. A magnitude value of the first complex data of the predetermined region is set to r. The vector v2 is complex data acquired by applying a low frequency filter to the predetermined region. The vector v2 has a magnitude value between 0 and r and may have any phase. When a high frequency filter is applied to the first complex data of the predetermined region, a vector v3 is obtained by subtracting the vector v2 from the vector v1.

Since a sum of lengths of two of three sides of a triangle formed by the vectors v1, v2, and v3 is longer than a length of the third side, a value obtained by subtracting r from a sum of a magnitude of second complex data and a magnitude value of third complex data is greater than 0.

As shown in FIG. 9B, if a magnitude value of the vector v2, which is acquired by applying a low frequency filter to the vector v1, is r, and the vector v2 has a phase difference of 180° with respect to the vector v1, a magnitude value of the vector v3 that is a difference between the vectors v1 and v2 may be 2r. Also, as shown in FIG. 9C, if the magnitude value of the v2, which is acquired by applying the low frequency filter to the vector v1 is r, and the vector 2 has the same phase as the vector v1, the magnitude value of the vector v3 that is the difference between the vectors v1 and v2 may be 0. Accordingly, a magnitude value of second complex data acquired by applying a high frequency filter to first complex data may between 0 and 2r.

The value 2r may be obtained by subtracting r from a sum of the magnitude value of the vector v2 of FIG. 9B and the magnitude value of the vector v3 obtained by subtracting the vector v2 from the vector v1. The value 0 may be obtained by subtracting from a sum of the magnitude value of the vector v2 and the magnitude value of the vector v3 acquired by the subtraction of the vector v2 from the vector v1 in FIG. 9C. Accordingly, the value obtained by subtracting r from the sum of the magnitude values of the second complex data and the third complex data may be between 0 and 2r.

Figure 10:
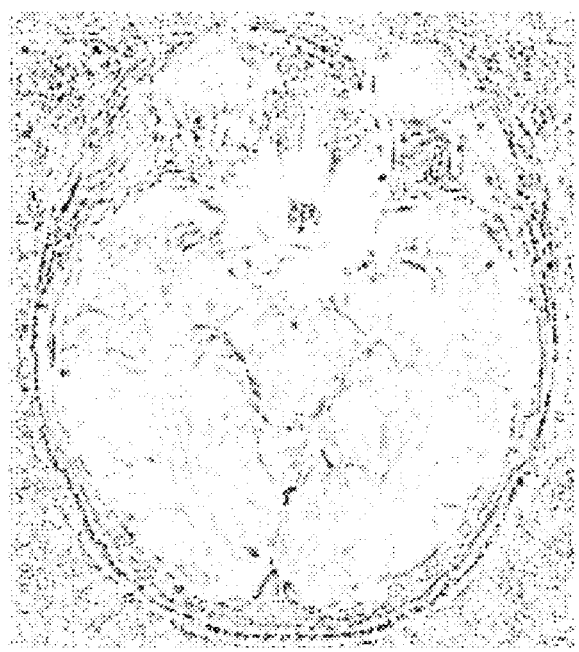
FIG. 10 illustrates a susceptibility weighted mask generated according to a method described in relation to FIGS. 8A through 8D.

FIG. 10 is a view illustrating a susceptibility weighted mask generated according to the method described with reference to FIGS. 8A through 8D.

Figure 11:
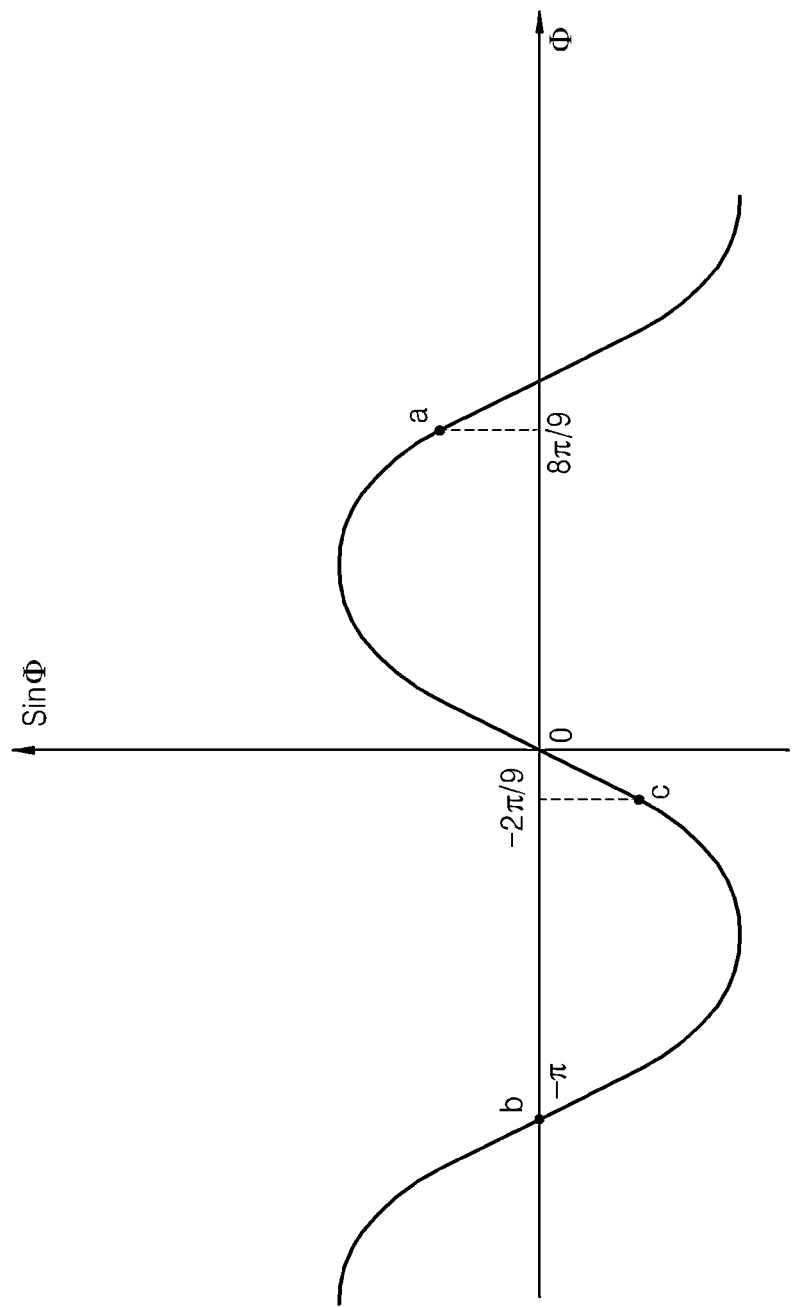
FIG. 11 is a graph illustrating imaginary data differences between the regions of an object caused by phase value differences between the regions of the object, when a high frequency filter is applied to imaginary data of first complex data in an MRI apparatus according to an alternative embodiment of the present disclosure.

FIG. 11 is a graph illustrating an imaginary data difference due to a phase value difference between regions of an object when a high frequency filter is applied to the imaginary data of first complex data in an MRI apparatus 300 according to an alternative embodiment of the present disclosure.

A difference between two imaginary data pieces is a magnitude value of imaginary data acquired by subtracting one of the two imaginary data pieces from the other one.

In the MRI apparatus 300 according to an alternative embodiment of the present disclosure, the second data acquirer 320 may apply a high frequency filter to the imaginary data of the first complex data to acquire second complex data.

The graph of FIG. 11 shows sin Φ versus a phase value Φ, and sin Φ is imaginary data, which is an imaginary part of the first complex data.

On the basis of the phase values of the regions of FIG. 4, a point a in FIG. 11 represents the imaginary data of the h and p regions of FIG. 4, and a point b in FIG. 11 represents the imaginary data of the i region of FIG. 4. A point c in FIG. 11 represents the imaginary data of the q region of FIG. 4.

Referring to FIG. 11, an imaginary data difference between the points a and c is greater than that between the points a and b. Therefore, a high frequency filter may be applied to the imaginary data of the first complex data of FIG. 4 and a magnitude value of the imaginary data to which the high frequency filter has been applied may be used to generate a susceptibility weighted mask. Therefore, the q region may be more emphasized than the i region.

Since the high frequency filter is applied to the imaginary data of the first complex data, the amount of computational power and processes for generating the susceptibility weighted mask may be reduced.

FIG. 12 is a flowchart illustrating a method of generating a susceptibility weighted image according to an embodiment of the present disclosure. Referring to FIG. 12, the method includes steps and operations sequentially performed by the MRI apparatus 300 of FIG. 3. Accordingly, the description of the MRI apparatus 300 of FIG. 3 may also be included in the description of the method of FIG. 12.

In step S1210, the MRI apparatus 300 acquires at least one first complex data piece by using an RF signal received from an object.

In particular, the MRI apparatus 300 may acquire k-space data by using an RF signal received from at least one region of the object, and may also perform an inverse Fourier transformation on the k-space data to acquire the at least one first complex data piece.

In step S1220, the MRI apparatus 300 applies a predetermined filter to the at least one first complex data piece. The MRI apparatus 300 may set a magnitude value of the at least one first complex data piece to a predetermined constant value, and may apply a high frequency filter to the at least one first complex data piece of which the magnitude value is set to the predetermined constant value.

In step S1230, the MRI apparatus 300 acquires at least one second complex data piece associated with the object.

In step S1240, the MRI apparatus 300 generates a susceptibility weighted mask associated with the object by using the magnitude value of the at least one second complex data piece. The MRI apparatus 300 may normalize the magnitude value of the at least one second complex data piece to a value between 0 and 1.

In step S1250, the MRI apparatus 300 applies the susceptibility weighted mask to an MRI image of the object to generate a susceptibility weighted image, which is then output, for example, to storage, to other facilities through a network or other communication methods, and/or to a display which may be included in the central controller 50 of FIG. 1 for viewing the susceptibility weighted image by doctors or other medical staff. Alternatively, the MRI apparatus 300 may multiply the MRI image of the object by the susceptibility weighted mask a predetermined number of times; that is, each iteration of the susceptibility weighted image may be generated by multiplying the previous multiplicative product by the susceptibility weighted mask a predetermined number of times to generate and output or display the susceptibility weighted image in order to improve a CNR of the susceptibility weighted image.

The embodiments of the present disclosure may be written as computer programs and may be implemented in general-use digital computers that execute the programs by using a non-transitory computer-readable recording medium.

Examples of the non-transitory computer readable recording medium include magnetic storage media (e.g., ROM, floppy disks, hard disks, etc.), optical recording media (e.g., CD-ROMs, or DVDs), etc.

The apparatuses and methods of the disclosure may be implemented in hardware or firmware, or as software or computer code executed by hardware or firmware, or combinations thereof. Various components such as a controller, a central processing unit (CPU), a processor, and any unit or device of the disclosure includes at least hardware and/or other physical structures and elements. In addition, the software or computer code may also be stored in a non-transitory recording medium such as a CD ROM, a RAM, a ROM whether erasable or rewritable or not, a floppy disk, CDs, DVDs, memory chips, a hard disk, a magnetic storage media, an optical recording media, or a magneto-optical disk or computer code downloaded over a network originally stored on a remote recording medium, a computer readable recording medium, or a non-transitory machine readable medium and to be stored on a local recording medium, so that the methods of the disclosure may be rendered in such software, computer code, software modules, software objects, instructions, applications, applets, apps, etc. that is stored on the recording medium using a general purpose computer, a digital computer, or a special processor or in programmable or dedicated hardware, such as an ASIC or FPGA. As would be understood in the art, the computer, the processor, the microprocessor controller, or the programmable hardware include volatile and/or non-volatile storage and memory components, e.g., RAM, ROM, Flash, etc. that may store or receive software or computer code that, when accessed and executed by the computer, processor or hardware, implement the processing methods of the disclosure. In addition, it would be recognized that when a general purpose computer accesses code for implementing the processing of the disclosure, the execution of the code transforms the general purpose computer into a special purpose computer for executing the processing of the disclosure. In addition, the program may be electronically transferred through any medium such as communication signals transmitted by wire/wireless connections, and their equivalents. The programs and computer readable recording medium may also be distributed in network-coupled computer systems so that the computer readable code is stored and executed in a distributed fashion.

Although the disclosure been discussed, various modifications may be made without departing from the disclosure. Therefore, the disclosure is not limited to the embodiments but defined by the appended claims and the equivalents thereof.

What is claimed is:

1. A method of generating a susceptibility weighted image of an object in a magnetic resonance imaging (MRI) apparatus, the method comprising:
    acquiring at least one first complex data piece corresponding to an a radio frequency (RF) signal received from the object;
    applying a predetermined filter to a rectangular coordinate of the at least one first complex data piece to acquire at least one second complex data piece wherein the at least one second complex data piece is based on a difference between adjacent data of the at least one of first complex data piece represented by the rectangular coordinate form comprising a real number portion and an imaginary number portion;
    generating a susceptibility weighted mask by using the at least one second complex data piece;
    applying the susceptibility weighted mask to an MRI image of the object to generate the susceptibility weighted image.

2. The method of claim 1, wherein the generating of the susceptibility weighted mask comprises:
    acquiring a magnitude value of the at least one second complex data piece; and
    generating the susceptibility weighted mask by using the acquired magnitude value.

3. The method of claim 1, wherein the acquiring of the at least one second complex data piece comprises:
    setting a magnitude value of the at least one first complex data piece to a predetermined constant value; and
    applying a high frequency filter to the at least one first complex data piece having the magnitude value set to the predetermined constant value to acquire the at least one second complex data piece.

4. The method of claim 3, wherein the generating of the susceptibility weighted mask comprises:
    applying a low pass filter to the at least one first complex data piece having the magnitude value set to the predetermined constant value to acquire at least one third complex data piece; and
    generating the susceptibility weighted mask by using a value obtained by subtracting the predetermined constant value from a sum of the magnitude value of the at least one second complex data piece and the magnitude value of the at least one third complex data piece.

5. The method of claim 3, wherein the generating of the susceptibility weighted mask comprises:
    normalizing the magnitude value of the at least one second complex data piece to a value between 0 and 1.

6. The method of claim 5, wherein the normalizing of the magnitude value of the at least one second complex data piece comprises:

dividing the magnitude value of the at least one second complex data piece by a product of the predetermined constant value and 2.

7. The method of claim 4, wherein the generating of the susceptibility weighted mask further comprises:
dividing the value obtained by subtracting the predetermined constant value from a sum of the magnitude value of the at least one second complex data piece and the magnitude value of the at least one third complex data piece by a product of the predetermined constant value and 2 to normalize the value obtained by the subtraction to a value between 0 and 1.

8. The method of claim 1, wherein the acquiring of the at least one second complex data piece comprises:
applying a high frequency filter to the imaginary portion of the at least one first complex data piece to acquire the at least one second complex data piece.

9. The method of claim 1, wherein the generating of the susceptibility weighted image comprises:
multiplying the MRI image of the object by the susceptibility weighted mask a predetermined number of times to generate the susceptibility weighted image.

10. A magnetic resonance imaging (MRI) apparatus comprising:
a radio frequency (RF) coil for receiving an RF signal from an object; a memory configure to store a computer code; and at least one processor configured to execute the store computer code to: acquire at least one first complex data piece corresponding to the RF signal received from the object;
apply a predetermined filter to a rectangular coordinate of the at least one first complex data piece to acquire at least one second complex data piece wherein the at least one second complex data piece is based on a difference between adjacent data of the at least one of first complex data piece represented by the rectangular coordinate form comprising a real number portion and an imaginary number portion;
generate a susceptibility weighted mask by using the at least one second complex data piece;
apply the susceptibility weighted mask to an MRI image of the object to generate a susceptibility weighted image.

11. The MRI apparatus of claim 10, wherein the at least one processor is further configure to generate the susceptibility weighted mask by using a magnitude value of the at least one second complex data piece.

12. The MRI apparatus of claim 10, wherein the at least one processor is further configure to set magnitude value of the at least one first complex data piece to a predetermined constant value and apply a high frequency filter to the at least one first complex data piece having the magnitude value set to the predetermined constant value to acquire the at least one second complex data piece.

13. The MRI apparatus of claim 12, wherein:
the at least one processor is further configured to apply a low pass filter to the at least one first complex data piece having the magnitude value set to the predetermined constant value to acquire at least one third complex data piece; and
generate the susceptibility weighted mask by using a value obtained by subtracting the predetermined constant value from a sum of the magnitude value of the at least one second complex data piece and the magnitude value of the at least one third complex data piece.

14. The MRI apparatus of claim 12, wherein the at least one processor is further configured to normalize a magnitude value of the at least one second complex data piece to a value between 0 and 1.

15. The MRI apparatus of claim 14, wherein the at least one processor is further configured to divide the magnitude value of the at least one second complex data piece by a product of the predetermined constant value and 2 to normalize the magnitude value of the at least one second complex data piece.

16. The MRI apparatus of claim 13, wherein the at least one processor is further configured to divide the value obtained by subtracting the predetermined constant value from a sum of the magnitude value of the at least one second complex data piece and the magnitude value of the at least one third complex data piece by a product of the predetermined constant value and 2 to normalize the value obtained by the subtraction to a value between 0 and 1.

17. The MRI apparatus of claim 10, wherein the at least one processor is further configured to apply a high frequency filter to the imaginary number portion of the at least one first complex data piece to acquire the at least one second complex data piece.

18. The MRI apparatus of claim 10, wherein at least one processor is further configured to multiply the MRI image of the object by the susceptibility weighted mask a predetermined number of times to generate the susceptibility weighted image.

19. A non-transitory computer-readable recording medium having recorded thereon a program for performing a method, the method comprising: acquiring at least one first complex data piece corresponding to an a radio frequency (RF) signal received from an object; applying a predetermined filter to a rectangular coordinate form of the at least one first complex data piece to acquire at least one second complex data piece, wherein the at least one second complex data piece is based on a difference between adjacent data of the at least one of first complex data piece represented by the rectangular coordinate form comprising a real number portion and an imaginary number portion; generating a susceptibility weighted mask by using the at least one second complex data piece; and applying the susceptibility weighted mask to an MRI image of the object to generate the susceptibility weighted image.

* * * * *